(12) United States Patent
Bour et al.

(10) Patent No.: US 7,638,810 B2
(45) Date of Patent: Dec. 29, 2009

(54) GAN LASER WITH REFRACTORY METAL ELOG MASKS FOR INTRACAVITY CONTACT

(75) Inventors: David P. Bour, Cupertino, CA (US); Scott W Corzine, Sunnyvale, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 492 days.

(21) Appl. No.: 11/223,622

(22) Filed: Sep. 9, 2005

(65) Prior Publication Data
US 2007/0057270 A1    Mar. 15, 2007

(51) Int. Cl.
*H01L 29/207* (2006.01)

(52) U.S. Cl. .................. 257/98; 257/94; 257/95; 257/96; 257/99; 257/E21.566

(58) Field of Classification Search ............. 257/79, 257/88, 94, 95, 96, 98, 99, E21.566
See application file for complete search history.

(56) References Cited

U.S. PATENT DOCUMENTS

2002/0030198 A1*  3/2002  Coman et al. ............ 257/103
2005/0045894 A1*  3/2005  Okuyama et al. .......... 257/95

* cited by examiner

*Primary Examiner*—Kenneth A Parker
*Assistant Examiner*—Anthony Ho (57) ABSTRACT

Refractory metal ELOG mask are used for GaN based VCSELs and edge emitter structures to serve as intracavity contacts. In these structures the refractory metal ELOG masks serve both as ohmic contact metals as well as masks for ELOG.

19 Claims, 11 Drawing Sheets

GAN LASER WITH REFRACTORY METAL ELOG MASKS FOR INTRACAVITY CONTACT

BACKGROUND

An issue in fabricating GaN and other nitride based lasers concerns the high-resistance intra-cavity contacts that are typically formed with nitride semiconductor material. This typically arises due to the poor p-type conductivity of GaN and typically requires that the metal contacts be placed close to the active region to reduce heating and voltage drops. Typically involved etching process are required to place the metal contacts in the required locations of the GaN lasers.

SUMMARY

Refractory metal masks are used in accordance with the invention with an epitaxial layer overgrowth process (ELOG) and positioned relative to the laser active region to provide intracavity contacts and such that the refractory metal masks introduce minimal optical absorption loss. Refractory metal masks are used in place of $SiO_2$ or $Si_3N_4$ masks for selective ELOG and also function as ohmic contact metals.

DETAILED DESCRIPTION

Figure 1:
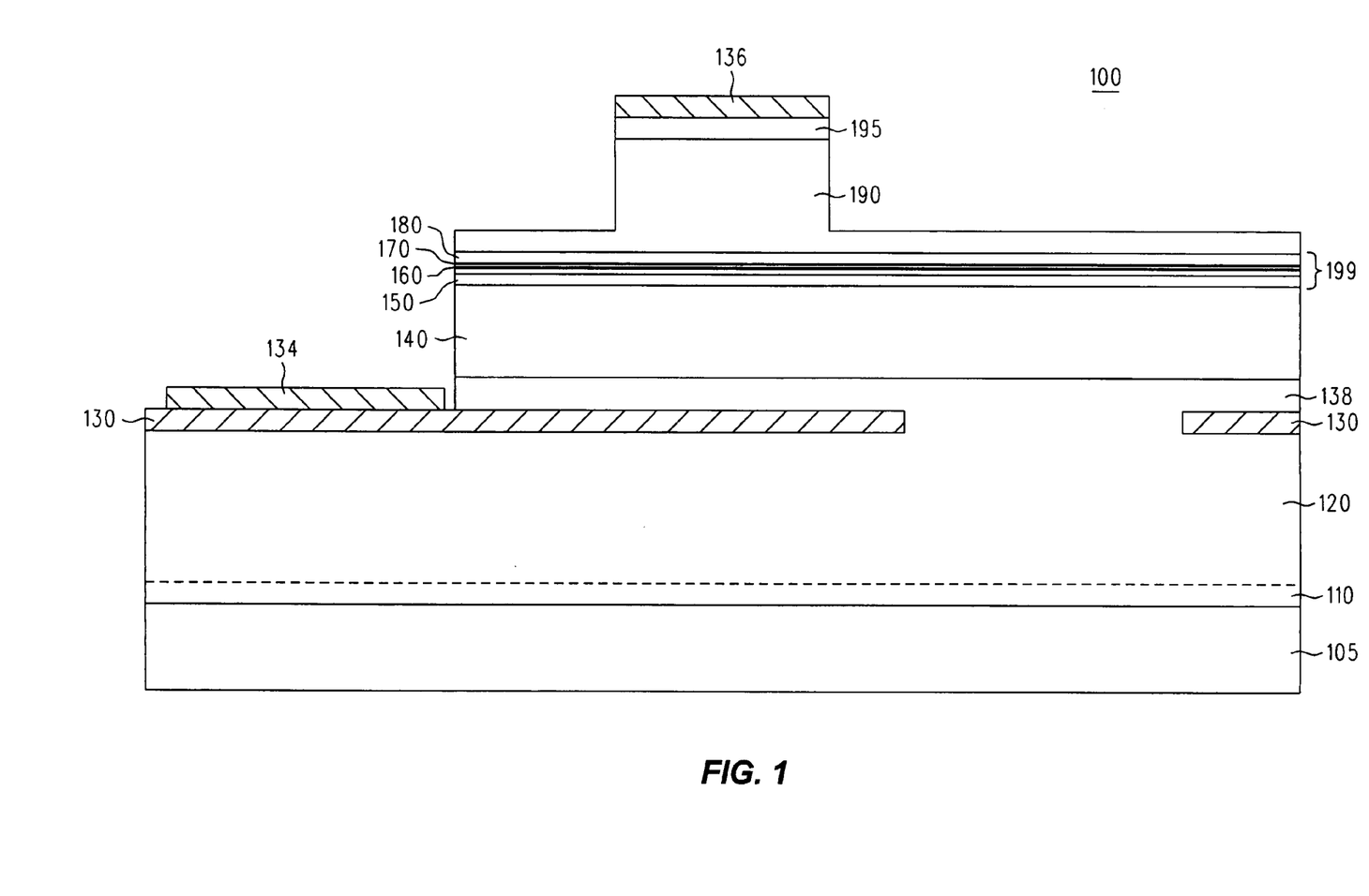
FIG. 1 shows an embodiment in accordance with the invention.

FIG. 1 shows an embodiment in accordance with the invention of GaN edge emitting laser structure 100. Substrate 105 is typically $Al_2O_3$ or SiC with GaN buffer layer 110 separating substrate 105 from n-GaN layer 120. Refractory metal ELOG masks 130 is a layer that overlies n-GaN layer 120. Refractory metal ELOG masks 130 may be made from Ti, Pt, W, Re Mo, Cr, Ni, Pd or other suitable refractory metal. ELOG layers, n-GaN layer 138, n-AlGaN lower cladding layer 140, InGaN separate confinement heterostructure layer 150, InGaN multiple quantum wells 160, AlGaN electron blocking layer 170 which prevents electron leakage, InGaN separate confinement heterostructure layer 180, p-type AlGaN upper cladding layer 190 and p-type GaN layer 195 overlie refractory metal ELOG mask 130. N-metal contact 134 contacts refractory metal layer 130 to provide efficient current injection into active region 199 of GaN edge emitting ridge waveguide laser structure 100. P-metal contact 136 is positioned over p-type GaN layer 195.

Figure 2A:
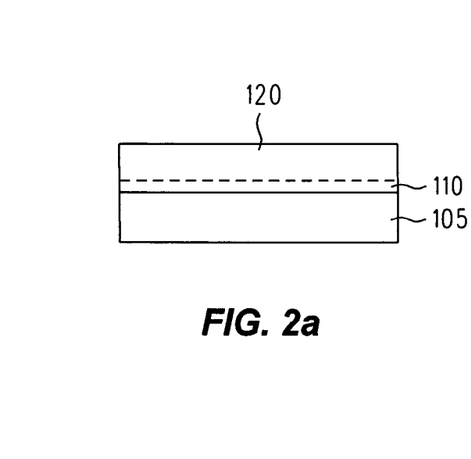
FIGS. 2a-f show steps for making the embodiment in accordance with the invention shown in FIG. 1.
Figure 2B:
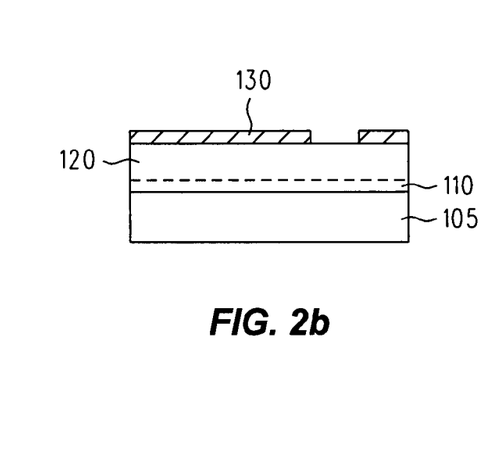
Figure 2C:
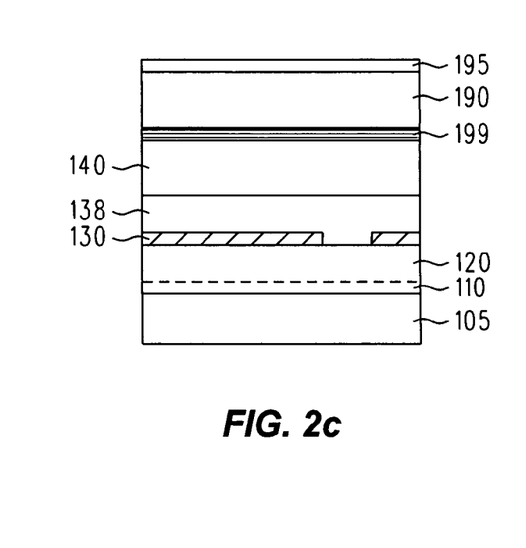

Typically GaN edge emitting laser structure 100 is made by taking substrate 105, typically $Al_2O_3$ or SiC and depositing GaN buffer layer 110 over it to a typical thickness of about 30 nm. Then planar n-type GaN layer 120 is deposited over GaN buffer layer 110 as shown in FIG. 2a. Refractory metal ELOG mask 130 is deposited by sputtering or evaporation and patterned by chemically assisted ion beam etching (CAIBE) or reactive ion-etching (RIE) over n-GaN layer 120. Then ELOG growth is started using refractory metal ELOG mask 130 for growing n-GaN layer 138 to a typical thickness of about 1 to about 2 µm; n-AlGaN lower cladding layer 140 has a typical thickness of about 1 µm; active region 199 which comprises InGaN separate confinement heterostructure layer 150 has a typical thickness of about 0.1 µm, InGaN multiple quantum wells 160, AlGaN electron blocking layer 170 has a typical thickness of about 20 nm, and InGaN separate confinement heterostructure layer 180 has a typical thickness of about 0.1 µm (see FIG. 1); p-type AlGaN upper cladding layer 190 has a typical thickness of about 0.5 µm and p-type GaN layer 195 has a typical thickness of about 0.1 µm.

Figure 2D:
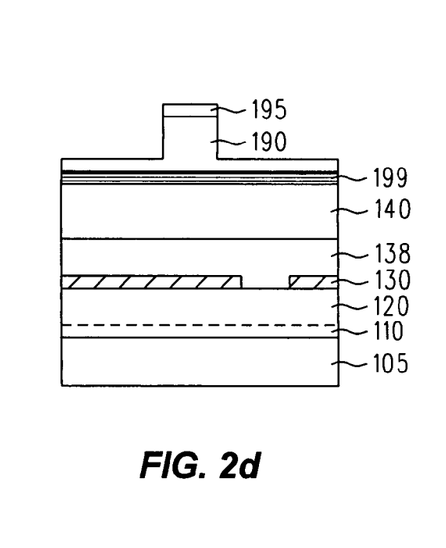
Figure 2E:
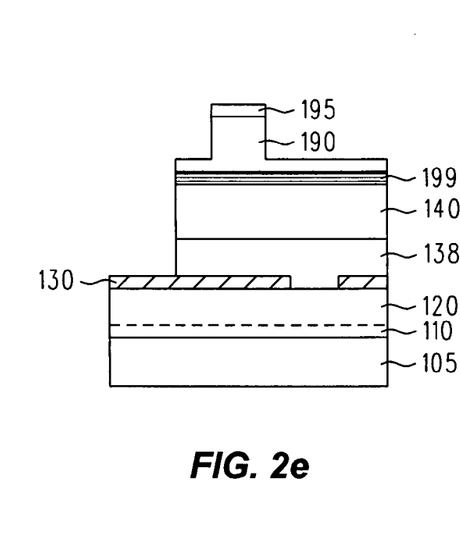
Figure 2F:
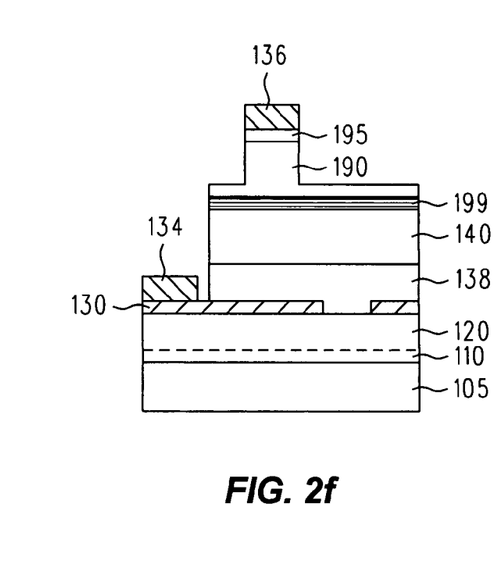

FIG. 2d shows etching typically by CAIBE or RIE to make the typical wave guide structure by etching through p-type GaN layer 195 and into p-type AlGaN upper cladding layer 190. A second etch by CAIBE or RIE down to refractory metal layer 130 is performed as shown in FIG. 2e to provide a contact area for n-metal contact 134. Finally, n-metal contact 134 and p-metal contact 136 are deposited and annealed.

Figure 3:
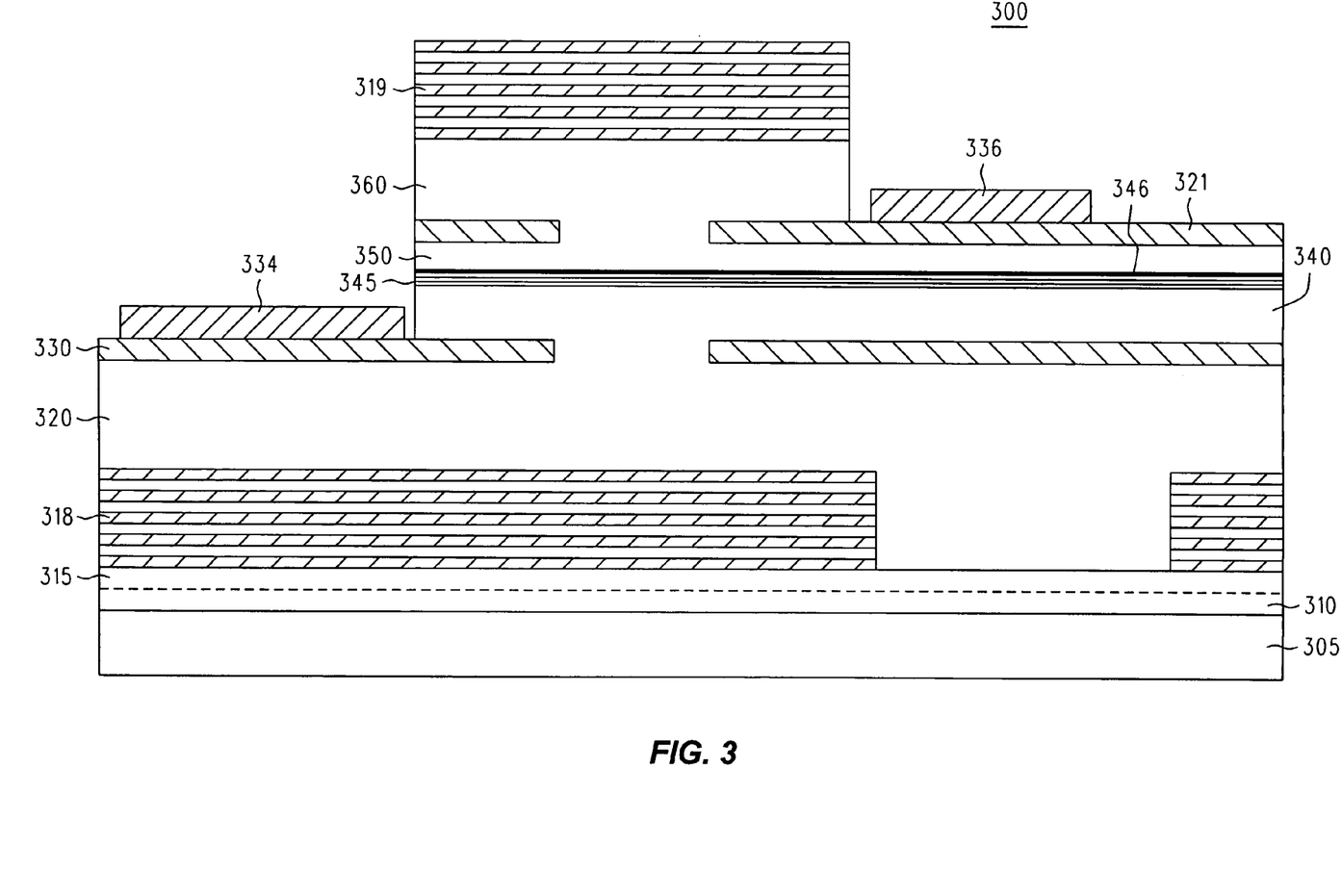
FIG. 3 shows an embodiment in accordance with the invention.

FIG. 3 shows an embodiment in accordance with the invention of GaN VCSEL laser structure 300 having ELOG n- and p-refractory metal masks with a lower DBR ELOG mask. Substrate 305 is typically $Al_2O_3$ or SiC with GaN buffer layer 310 having a typical thickness of about 30 nm and separating substrate 305 from n-GaN layer 315 with a typical thickness of about 1 µm to about 2 µm. Lower dielectric distributed Bragg reflector (DBR) 318 overlies GaN buffer layer 310. ELOG n-GaN layer 320 with a typical thickness of about 3 µm overlies lower dielectric DBR 318 and n-refractory metal ELOG mask 330 is a layer that overlies ELOG n-GaN layer 320. N-refractory metal ELOG mask 330 may be made from Ti, Pt, W, Re Mo, Cr, Ni, Pd or other suitable refractory metal. Care must be taken to place n-refractory metal ELOG mask 330 at a null of the standing wave set up between lower dielectric DBR 318 and upper dielectric DBR 319. N-refractory metal ELOG mask 330 typically has a thickness of about 50 nm or less. ELOG layer n-GaN 340 with a typical thickness of about 1 µm to about 2 µm, InGaN multiple quantum well active region 345, p-AlGaN layer 346 having a typical thickness of about 20 nm and p-GaN layer 350 with a typical thickness of about 1 µm to about 2 µm overlie refractory metal ELOG mask 330. P-refractory metal ELOG mask 321 is a layer that overlies p-GaN layer 350. Care must be taken to place p-refractory metal ELOG mask 321 at a null of the standing wave set up between lower dielectric DBR 318 and upper dielectric DBR 319. P-refractory metal ELOG mask 321 typically has a thickness of about 50 nm or less. P-doped refractory metal ELOG mask 321 may be made from Ti, Pt, W, Re Mo, Cr, Ni, Pd or other suitable refractory metal. P-GaN layer 360 with a typical thickness of about 1 µm to about 5 µm overlies p-doped refractory metal ELOG mask 321 and upper dielectric DBR 319. N-metal contact 334 contacts n-refractory metal layer 330 and p-metal contact 336 contacts p-refractory metal layer 321 to provide efficient current injection into VCSEL structure 300.

Figure 4A:
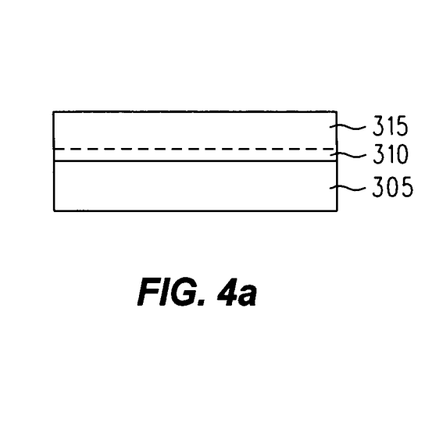
FIGS. 4a-f show steps for making the embodiment in accordance with the invention shown in FIG. 3.
Figure 4B:
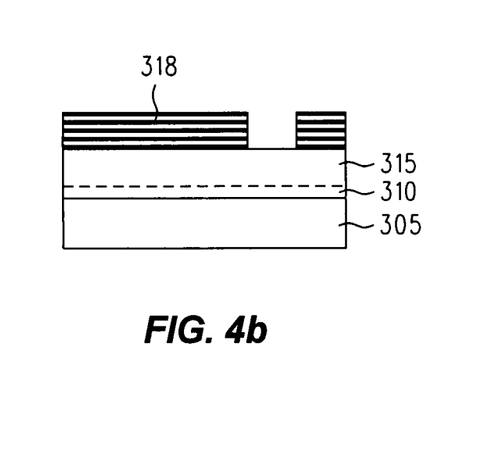
Figure 4C:
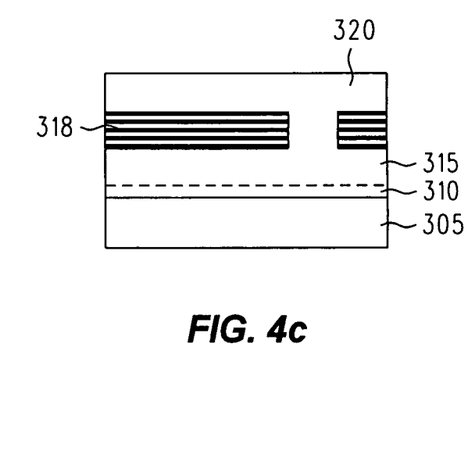
Figure 4D:
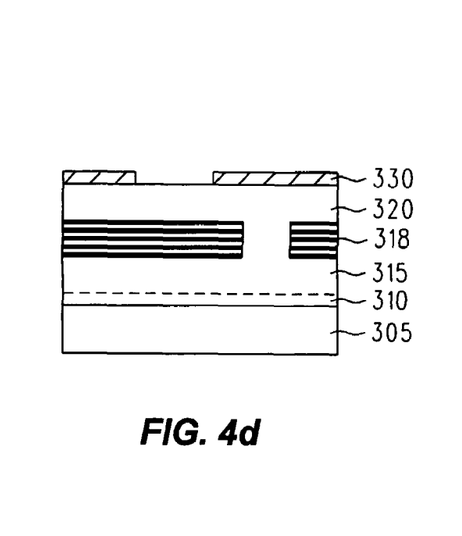
Figure 4E:
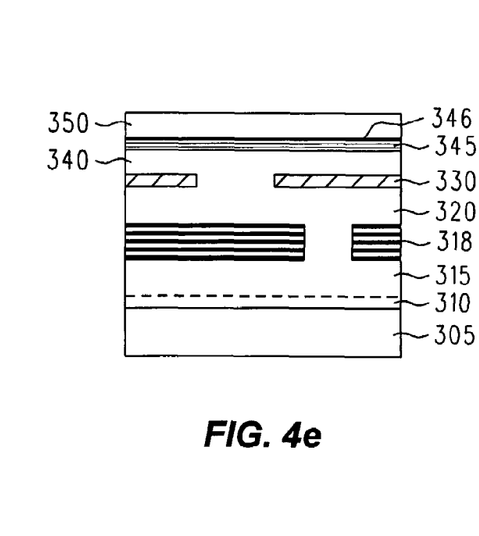
Figure 4F:
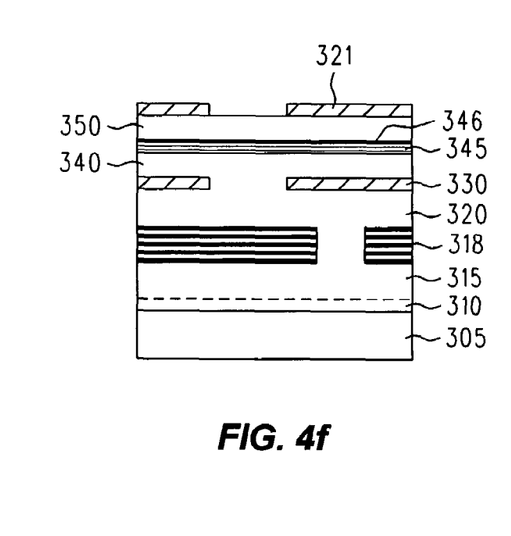
Figure 4G:
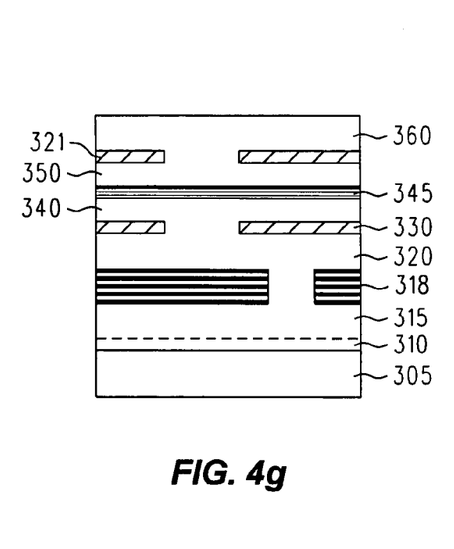
Figure 4H:
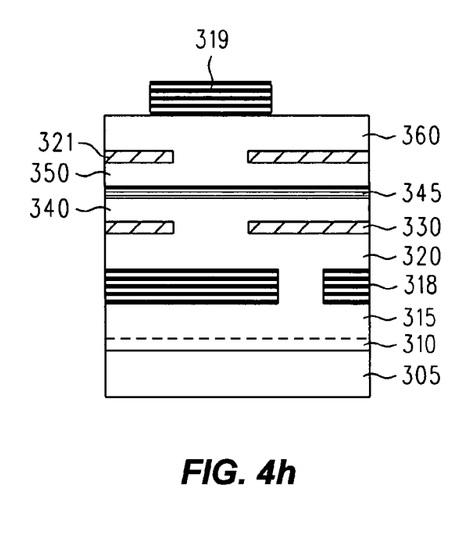
Figure 4I:
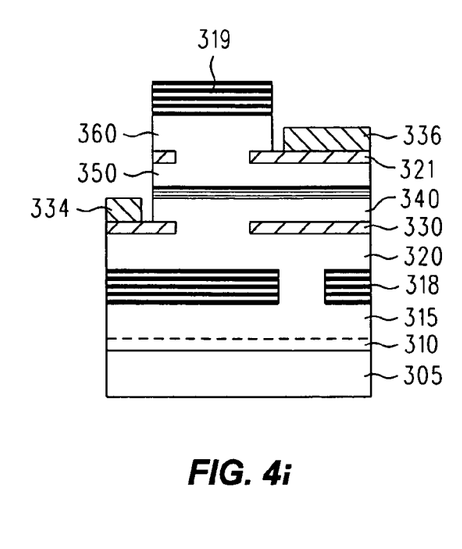

Typically, GaN VCSEL structure 300 is made by taking substrate 305, typically $Al_2O_3$ or SiC and depositing GaN buffer layer 310 to a typical thickness of about 30 nm over it. Then planar n-type GaN layer 315 is deposited to a thickness of about 1 µm to about 2 µm over GaN buffer layer 310 as shown in FIG. 4a. Lower dielectric DBR 318 is then deposited and patterned as shown in FIG. 4b. Lower dielectric DBR 318 serves as an ELOG mask for ELOG of n-GaN layer 320 having a typical thickness of about 3 µm and is shown in FIG. 4c. Then n-refractory metal ELOG mask 330 is deposited and patterned as shown in FIG. 4d. With reference to FIG. 4e, n-refractory metal ELOG mask 330 is then used to ELOG grow n-type GaN layer 340 having a typical thickness of about 1 µm to about 2 µm, InGaN multiple quantum well active region 345, p-type AlGaN layer 346 with a typical thickness of about 20 nm and p-type GaN layer 350 with a typical thickness of about 1 µm to about 2 µm. After growing p-doped GaN layer 350, p-refractory metal ELOG mask 321 is deposited on p-doped GaN layer 350 and patterned as shown in FIG. 4*f*. ELOG of p-doped GaN layer 360 is then performed to a typical thickness of about 1 µm to about 5 µm using p-refractory metal ELOG mask 321 as shown in FIG. 4*g*. Upper DBR 319 is then deposited on p-doped GaN layer 360 and etched as shown in FIG. 4*h*. Finally, as shown in FIG. 4*i*, etches are performed down to refractory metal layers 321 and 330 where n-electrode 334 and p-electrode 335 are deposited, respectively.

Figure 5:
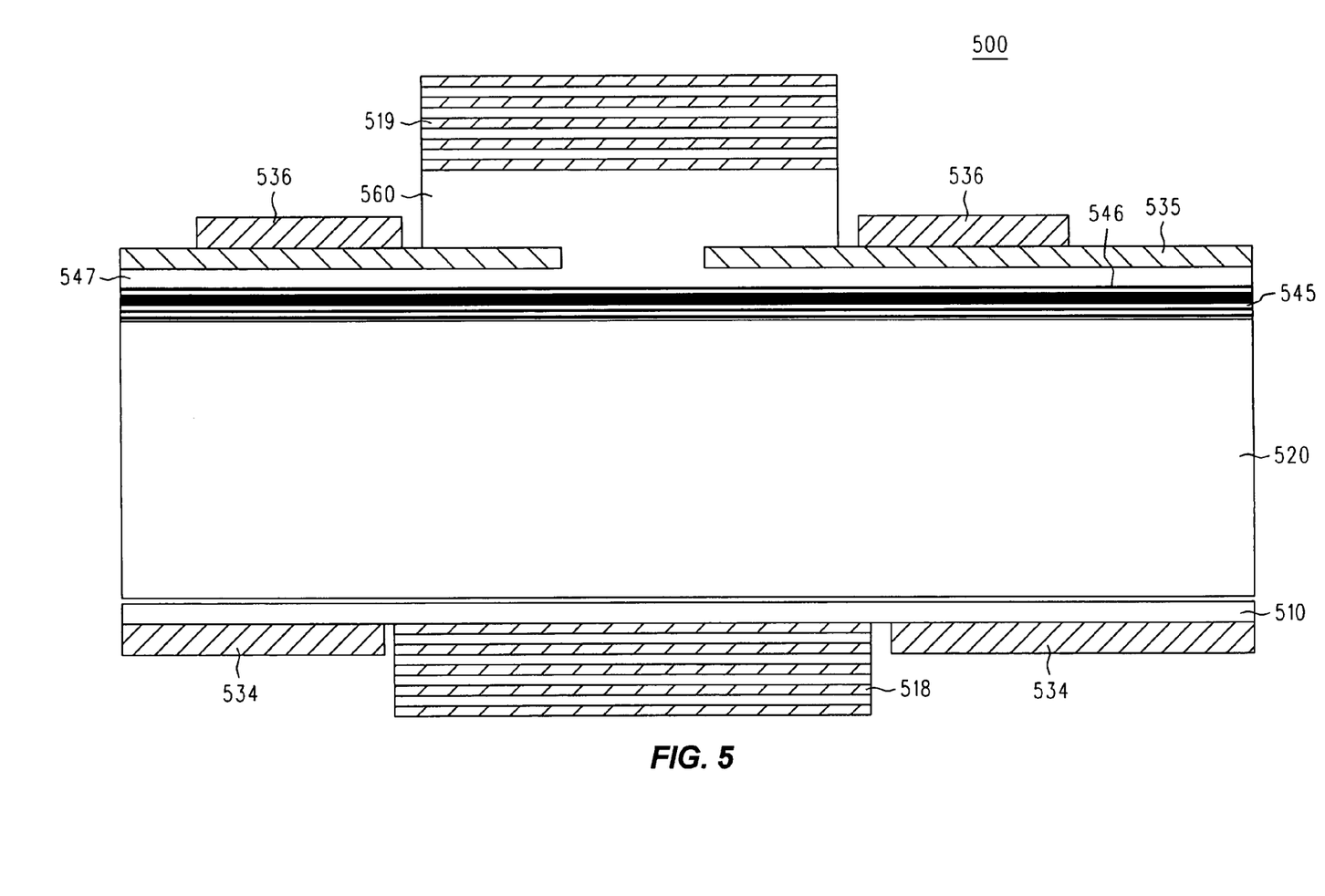
FIG. 5 shows an embodiment in accordance with the invention.

FIG. 5 shows an embodiment in accordance with the invention of GaN VCSEL laser structure 500 having an ELOG p-refractory metal mask and using a lower DBR deposited on an n-GaN layer after removal of the substrate by laser liftoff or other suitable technique. N-type GaN layer 520 with a typical thickness of about 4 µm has n-contacts 534 attached on the bottom surface along with lower DBR 518. InGaN multiple quantum well active region 545 overlies n-type GaN layer and is topped by AlGaN layer 546 having a typical thickness of about 20 nm. P-type GaN layer 547 having a typical thickness of about 0.2 µm to about 2 µm overlies AlGaN layer 546. P-refractory metal ELOG mask 535 is a layer that overlies p-type GaN layer 547 and ELOG p-type GaN layer 560 having a typical thickness of about 1 µm to about 4 µm overlies p-type GaN layer 547. Care must be taken to place p-refractory metal ELOG mask 535 at a null of the standing wave set up between lower dielectric DBR 518 and upper dielectric DBR 519. P-refractory metal ELOG mask 321 typically has a thickness of about 50 nm or less. Upper DBR mirror 519 sits on ELOG p-type GaN layer 560 and p-type electrodes 536 are attached to p-type refractory metal layer 535.

Figure 6A:
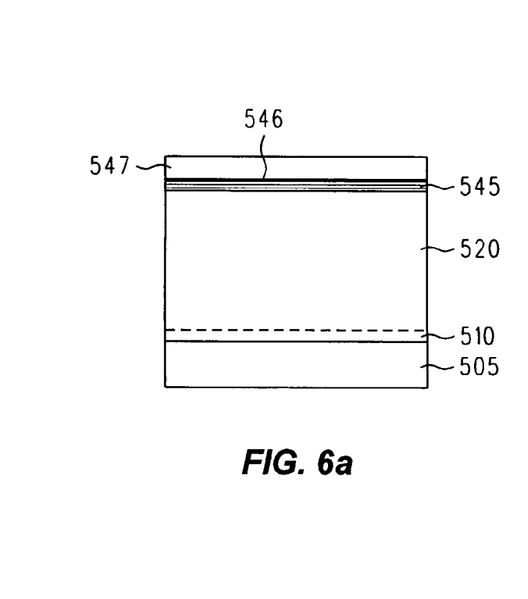
FIGS. 6a-g show steps for making the embodiment in accordance with the invention shown in FIG. 5.
Figure 6B:
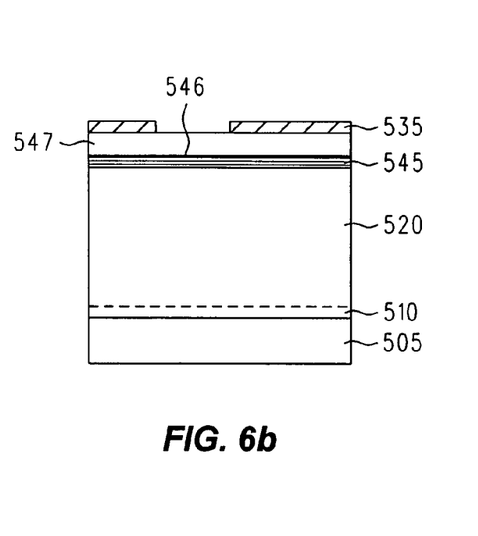
Figure 6C:
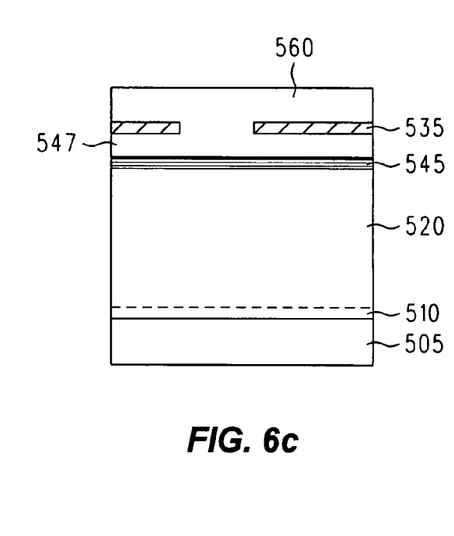
Figure 6D:
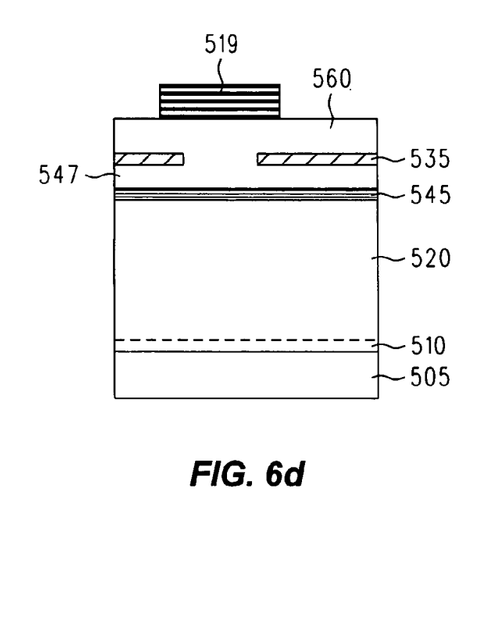
Figure 6E:
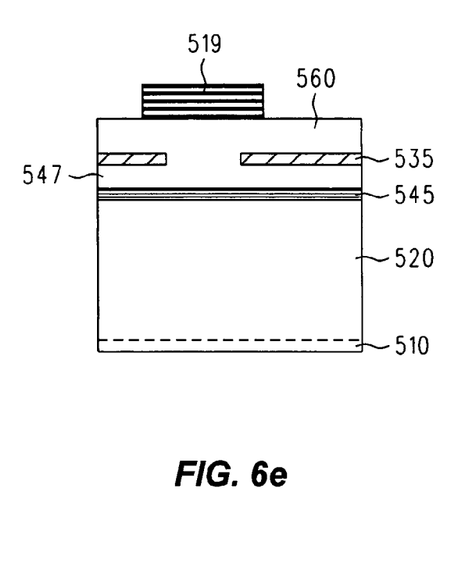
Figure 6F:
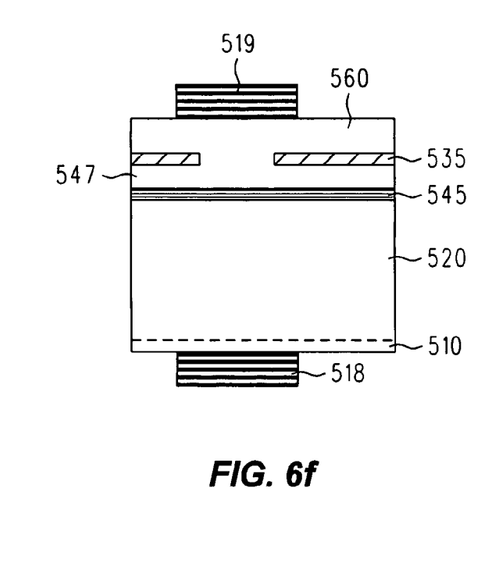
Figure 6G:
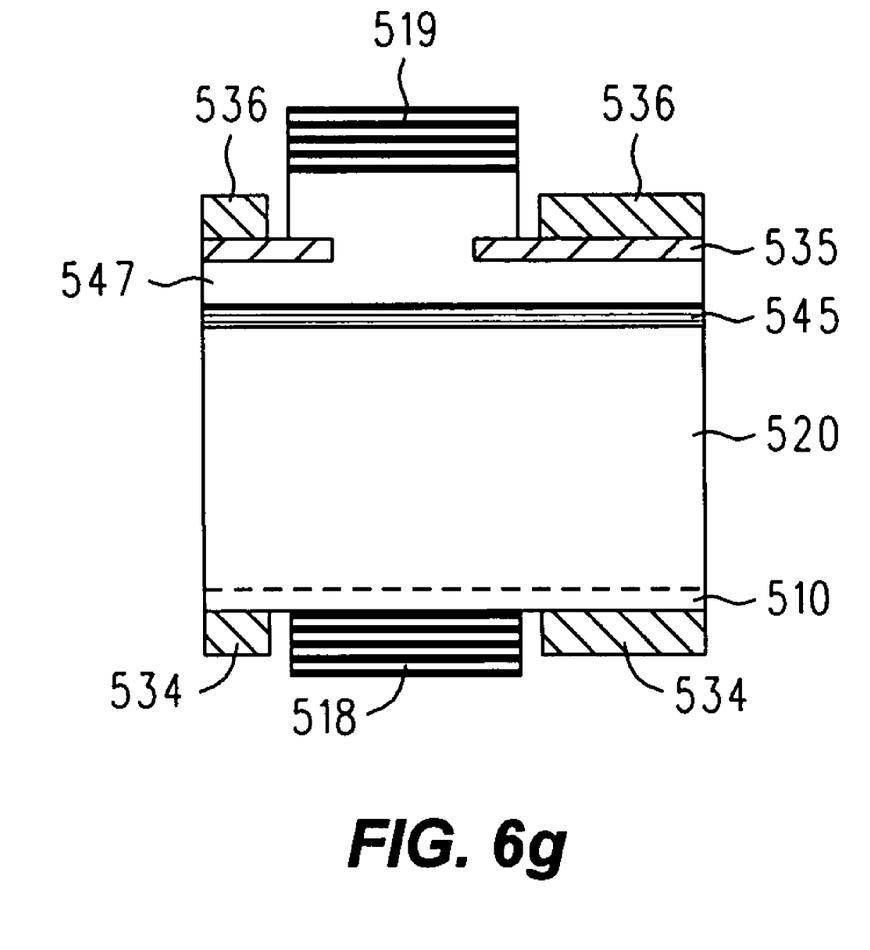

Typically, GaN VCSEL structure 500 may be made by taking substrate 505, typically $Al_2O_3$ or SiC and depositing GaN buffer layer 510 to a typical thickness of about 30 nm over it. Planar growth is performed for n-type GaN layer 520 having a typical thickness of about 4 µm, InGaN multiple quantum well active region 545, AlGaN layer 546 having a typical thickness of about 20 nm and p-type GaN layer 547 with a typical thickness of about 0.2 µm to 2 µm as shown in FIG. 6*a*. P-refractory metal ELOG mask 535 is deposited on p-type GaN layer 547 and patterned as shown in FIG. 6*b*. Then ELOG growth of p-GaN layer 560 to a typical thickness of about 1 µm to about 4 µm is performed as shown in FIG. 6*c*. Upper DBR 519 is deposited on p-GaN layer 560 and patterned as shown in FIG. 6*d*. Substrate 505 is subsequentally removed by laser liftoff leaving the VCSEL structure shown in FIG. 6*e*. Lower DBR 518 is deposited on the bottom of GaN buffer layer 510 and patterned as shown in FIG. 6*f*. Finally, an RIE or CAIBE etch is performed through p-GaN layer 560 down to p-refractory ELOG metal mask 535 to deposit p-type electrodes 536 and n-type electrodes 534 on the bottom of GaN buffer layer 510.

The invention claimed is:

1. A nitride semiconductor laser structure comprising:
a plurality of semiconductor layers;
an active region surrounded by said plurality of semiconductor layers;
an upper and lower reflector located on opposite sides of said active region;
a first refractory metal layer disposed parallel to and penetrating into at least one of said plurality of semiconductor layers such that said first refractory metal layer is disposed on a first side of said active region; and
a first metal contact electrically coupled to said first refractory metal layer;
wherein said first refractory metal layer is positioned at a null of a standing wave capable of being generated between said upper and said lower reflector.

2. The structure of claim 1 wherein said first metal contact is an n-type metal contact.

3. The structure of claim 1 further comprising a second refractory metal layer disposed parallel to and penetrating into at least one of said plurality of semiconductor layers and located on a second side of said active region.

4. The structure of claim 3 further comprising a second metal contact electrically coupled to said second refractory metal layer.

5. The structure of claim 4 wherein said second metal contact is a p-type metal contact.

6. The structure of claim 1 further comprising a substrate on which said plurality of semiconductor layers are disposed.

7. The structure of claim 1 wherein said lower reflector is disposed deposed below said plurality of semiconductor layers.

8. The structure of claim 7 further comprising an n-metal contact adjacent to said lower reflector.

9. The structure of claim 1 wherein said active region comprises a multiple quantum well region.

10. The structure of claim 1 wherein said refractory metal layer comprises Pt.

11. The structure of claim 1 wherein said refractory metal layer comprises W.

12. The structure of claim 1 wherein said refractory metal layer comprises Re.

13. The structure of claim 1 wherein said refractory metal layer comprises Mo.

14. The structure of claim 1 wherein said refractory metal layer comprises Cr.

15. The structure of claim 1 wherein said refractory metal layer comprises Ni.

16. The structure of claim 1 wherein said refractory metal layer comprises Pd.

17. A method for a nitride semiconductor laser structure comprising:
providing a plurality of semiconductor layers;
surrounding an active region by said plurality of semiconductor layers;
providing an upper and lower reflector located on opposite sides of said active region;
disposing a first refractory metal layer parallel to and penetrating into at least one of said plurality of semiconductor layers such that said first refractory metal layer is disposed on a first side of said active region; and
providing a first metal contact electrically coupled to said first refractory metal layer;
wherein said first refractory metal layer is positioned at a null of a standing wave capable of being generated between said upper and said lower reflector.

18. The method of claim 17 wherein said first metal contact is an n-type metal contact.

19. The method of claim 17 further comprising a second refractory metal layer disposed parallel to and penetrating into at least one of said plurality of semiconductor layers and located on a second side of said active region.

* * * * *